(12) United States Patent
He (10) Patent No.: US 10,510,548 B2
(45) Date of Patent: Dec. 17, 2019

(54) SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventor: Xin He, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/422,006

(22) Filed: May 24, 2019

(65) Prior Publication Data

US 2019/0287811 A1 Sep. 19, 2019

Related U.S. Application Data

(62) Division of application No. 15/813,420, filed on Nov. 15, 2017, now Pat. No. 10,347,496.

(30) Foreign Application Priority Data

Nov. 30, 2016 (CN) .......................... 2016 1 1089134

(51) Int. Cl.
*H01L 21/00* (2006.01)
*H01L 21/306* (2006.01)
(Continued)

(52) U.S. Cl.
CPC .. *H01L 21/30604* (2013.01); *H01L 21/28185* (2013.01); *H01L 21/28194* (2013.01);
(Continued)

(58) Field of Classification Search
CPC ......... H01L 21/28185; H01L 21/28194; H01L 21/31055; H01L 21/823842; H01L 25/50;
(Continued)

(56) References Cited

U.S. PATENT DOCUMENTS

| 7,750,374 B2 * | 7/2010 | Capasso .......... H01L 21/823807 257/204 |
| 9,012,319 B1 | 4/2015 | Choi et al. |

(Continued)

FOREIGN PATENT DOCUMENTS

EP 2953162 A1 12/2015

*Primary Examiner* — Richard A Booth
(74) *Attorney, Agent, or Firm* — Anova Law Group, PLLC (57) ABSTRACT

Semiconductor structures are provided. The semiconductor structure includes a base including first, second, third, and fourth regions, used for first, second, third, and fourth transistors, respectively. A gate dielectric layer is on the first, second, third and fourth regions of the base. A first material layer is on the gate dielectric layer. A second material layer is on the first material layer above the fourth region. A third material layer is on the first material layer above the third region and on the second material layer above the fourth region. A fourth material layer is on the third material layer above the third and fourth regions and on the first material layer on the second region. The first material layer above the first region is used as a first work function layer for the first transistor.

6 Claims, 5 Drawing Sheets

(51) Int. Cl.
*H01L 21/8238* (2006.01)
*H01L 21/28* (2006.01)
*H01L 21/3105* (2006.01)
*H01L 25/00* (2006.01)
*H01L 29/423* (2006.01)
*H01L 29/49* (2006.01)
*H01L 29/78* (2006.01)
*H01L 21/8234* (2006.01)
*H01L 27/092* (2006.01)
*H01L 21/311* (2006.01)
*H01L 29/51* (2006.01)

(52) U.S. Cl.
CPC ............. *H01L 21/31055* (2013.01); *H01L 21/823842* (2013.01); *H01L 25/50* (2013.01); *H01L 29/42356* (2013.01); *H01L 29/42364* (2013.01); *H01L 29/42368* (2013.01); *H01L 29/4983* (2013.01); *H01L 29/78* (2013.01); *H01L 21/31144* (2013.01); *H01L 21/82345* (2013.01); *H01L 27/092* (2013.01); *H01L 29/518* (2013.01)

(58) Field of Classification Search
CPC ......... H01L 29/42356; H01L 29/42364; H01L 29/42368; H01L 29/4983; H01L 29/78; H01L 21/31144; H01L 21/82345; H01L 27/092; H01L 29/518
See application file for complete search history.

(56) References Cited

U.S. PATENT DOCUMENTS

| | | | |
|---|---|---|---|
| 9,178,036 B1 * | 11/2015 | Xie | .......... H01L 21/28176 |
| 9,530,778 B1 | 12/2016 | Lin et al. | |
| 2004/0171222 A1 | 9/2004 | Gao et al. | |
| 2012/0161237 A1 | 6/2012 | Jan et al. | |
| 2016/0225867 A1 | 8/2016 | Kim | |
| 2016/0225868 A1 | 8/2016 | Kim et al. | |
| 2016/0240630 A1 | 8/2016 | Seong et al. | |
| 2016/0322473 A1 | 11/2016 | Jangjian et al. | |
| 2016/0358920 A1 | 12/2016 | Kim | |
| 2019/0157165 A1 * | 5/2019 | Kim | .......... H01L 21/823842 |

* cited by examiner

SEMICONDUCTOR STRUCTURE

CROSS-REFERENCES TO RELATED APPLICATIONS

This application is a divisional of U.S. patent application Ser. No. 15/813,420, filed on Nov. 15, 2017, which claims priority of Chinese Patent Application No. 201611089134.0, filed on Nov. 30, 2016, the entire contents of which are hereby incorporated by reference.

FIELD OF THE INVENTION

The present disclosure generally relates to the field of semiconductor manufacturing technologies and, more particularly, relates to semiconductor structures.

BACKGROUND

With rapid development of semiconductor manufacturing technology, semiconductor devices develop toward higher element density, and higher integration level. Transistors are currently widely used as the most basic semiconductor devices. With increasing element density and integration level of the semiconductor devices, the characteristic sizes of the transistors are getting smaller and smaller. In order to reduce the parasitic capacitance of the transistor gate and improve device speed, gate structures having a high-K gate dielectric layer and a metal gate electrode are introduced into the transistor.

However, problems remain when forming a metal gate electrode on a high-K gate dielectric layer, due to a matching problem of the work function. The work function will directly influence the threshold voltage (Vt) of the device and the performance of the transistor. Thus, a work function layer is introduced into the high-K metal gate structure to adjust threshold voltage of the resultant device.

However, even if a work function layer is introduced in the high-K metal gate structure, the performance of the semiconductor structure in the existing technology still needs to be improved.

BRIEF SUMMARY OF THE DISCLOSURE

One aspect of the present disclosure provides a method for fabricating a semiconductor structure by providing a base including a first region, a second region, a third region, and a fourth region for forming a first transistor, a second transistor, a third transistor, and a fourth transistor, respectively. A gate dielectric layer is formed on the first, second, third and fourth regions of the base. A first material layer is formed on the gate dielectric layer. An etch stop layer is formed on the first material layer. The etch stop layer above the fourth region is removed. A second material layer is formed on the remaining etch stop layer and on the first material layer above the fourth region. The second material layer and the etch stop layer above the third region are removed to expose the first material layer above the third region. A third material layer is formed on the remaining second material layer above the first, second and further regions, and on the exposed first material layer above the third region. The etch stop layer, and the second and third material layers above the second region are removed to expose the first material layer above the second region. A fourth material layer is formed on the remaining third material layer above the first, second and further regions, and on the exposed first material layer above the third region. The etch stop layer and the second, third, and fourth material layers above the first region are removed to expose the first material layer above the first region.

Another aspect of the present disclosure provides a semiconductor structure. The semiconductor structure includes a base including a first region, a second region, a third region, and a fourth region, used for a first transistor, a second transistor, a third transistor, and a fourth transistor, respectively. A gate dielectric layer is on the first, second, third and fourth regions of the base. A first material layer is on the gate dielectric layer. A second material layer is on the first material layer above the fourth region. A third material layer is on the first material layer above the third region and on the second material layer above the fourth region. A fourth material layer is on the third material layer above the third and fourth regions and on the first material layer on the second region. The first material layer above the first region is used as a first work function layer for the first transistor. The first and fourth material layers above the second region are used as a second work function layer for the second transistor. The first, third and fourth material layers above the third region are used as a third work function layer for the third transistor. The first, second, third and fourth material layers above the fourth region are used as a fourth work function layer for the fourth transistor.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The objects, features and advantages of the present disclosure can be understood by those skilled in the art through the exemplary embodiments of the present disclosure and further described in detail with reference to the accompanying drawings.

Figure 1:
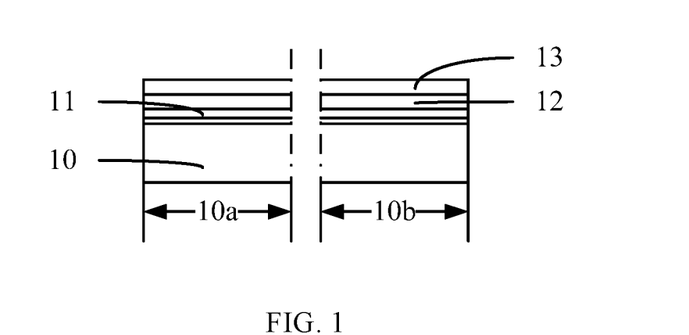
FIGS. 1-2 illustrate a schematic cross-sectional view corresponding to a method for forming a semiconductor structure.
Figure 2:
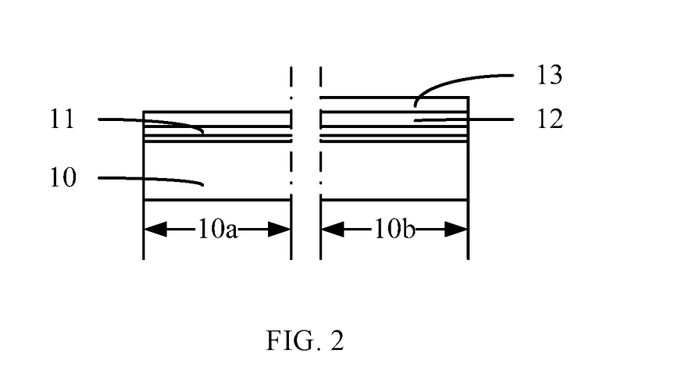

FIGS. 1-2 illustrate a schematic cross-sectional view corresponding to a method for forming a semiconductor structure.

As shown in FIG. 1, at the beginning of the fabrication process, a base is provided. The base may include a first region 10a and a second region 10b for forming N-type transistors. The work function layer for the transistor formed by the second region 10b of the base may have a thickness greater than the work function layer for the transistor formed by the first region 10a of the base.

As shown in FIG. 1, a gate dielectric layer 11 is formed on the base 10, and a first material layer 12 is formed on the gate dielectric layer 11. A second material layer 13 is formed on the first material layer 12.

As shown in FIG. 2, the second material layer 13 above the first region 10a of the base 10 is removed to expose the first material layer 12 above the first region 10a of the base 10.

The first material layer 12 above the first region 10a of the base 10 may be used for forming a work function layer for the N-type transistor formed by the first region 10a of the base 10. The first material layer 12 and the second material layer 13 above the second region 10b of the base 10 may be used for forming a work function layer for the N-type transistor formed by the second region 10b of the base 10. In some cases, the material of the first material layer 12 may include titanium nitride or tantalum nitride, and the material of the second material layer 13 may include titanium nitride.

The difference between the etching rates of titanium nitride and tantalum nitride may not be sufficiently large when removing the second material layer 13 above the first region 10a of the base 10. Thus, the process control for removing the second material layer 13 above the first region 10a of the base 10 may be substantially difficult. Accordingly, accurately controlling the thicknesses of the work function layers of different devices in the fabricated semiconductor structure may be substantially difficult, thereby influencing the adjustment of the threshold voltages of the different devices in the semiconductor structure and the performance of the semiconductor structure.

A semiconductor structure may be formed by: providing a base having a first region and a second region for forming transistors, where the work function layer for the transistor formed by the second region of the base may have a thickness greater than the work function layer for the transistor formed by the first region of the base; forming a gate dielectric layer on the base; forming a first material layer on the gate dielectric layer; forming an etch stop layer on the first material layer; removing the etch stop layer above the second region to expose the first material layer above the second region; forming a second material layer on the etch stop layer and the first material layer above the second region, where the second material layer and the first material layer above the second region may be used for forming a work function layer for the transistor formed by the second region of the base; removing the second material layer above the first region with the etch stop layer as a stopping layer (e.g., to stop the etch process), to expose the first material layer above the first region, where the first material layer above the first region may be used for forming a work function layer for the transistor formed by the first region of the base.

In the present disclosure, an etch stop layer may be formed on the first material layer after the formation of the first material layer; and the second material layer above the first region may be removed using the etch stop layer to stop the etch process. The process window for removing the second material layer above the first region may be effectively enlarged by adding the etch stop layer, thereby effectively reducing the process control difficulties for removing the second material layer above the first region. Accordingly, the accuracy of the thickness control of the work function layer in the semiconductor structure may be improved, and the performance of the semiconductor structure may be improved.

In addition, by removing the second material layer above the first region with the etch stop layer to stop the etch process, the gate dielectric layer may be protected by the etch stop layer, thereby facilitating thickness reduction of the first material layer, and thereby facilitating the adjustment of the threshold voltage of the corresponding transistor.

FIGS. 3-14 illustrate a schematic cross-sectional view corresponding to a step of an exemplary method for fabricating an exemplary semiconductor structure consistent with disclosed embodiments.

Figure 3:
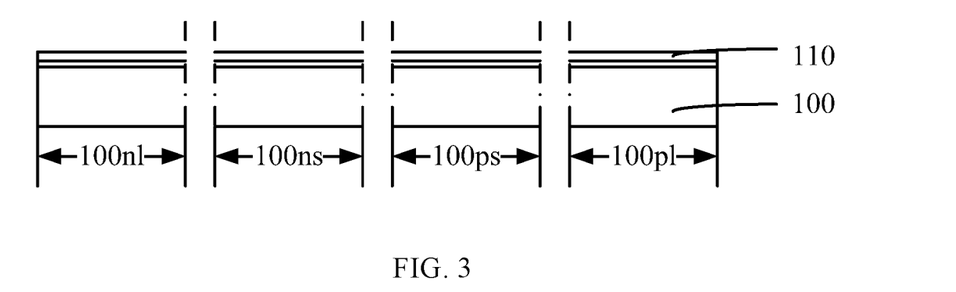
FIGS. 3-14 illustrate a schematic cross-sectional view corresponding to each step of an exemplary method for fabricating an exemplary semiconductor structure consistent with disclosed embodiments.

As shown in FIG. 3, the method for fabricating the semiconductor structure may include providing a base 100. The base 100 may include a first region 100nl and a second region 100ns for forming transistors. The work function layer for the transistor formed by the second region 100ns of the base 100 may have a thickness greater than the work function layer for the transistor formed by the first region 100nl of the base 100.

The base 100 may be used to provide a process operation platform.

In various embodiments, the material of the base 100 may include single crystal silicon. In certain embodiments, the material of the base may be selected from polycrystalline silicon or amorphous silicon. In other embodiments, the material of the base may also be selected from germanium, gallium arsenide, silicon germanium compounds, or other suitable semiconductor materials. In some embodiments, the base may include a silicon structure having an epitaxial layer or on an epitaxial layer.

In some embodiments, the semiconductor structure may include a planar transistor, and accordingly, the base 100 may be a planar base. In other embodiments, the semiconductor structure may include a fin field effect transistor, and accordingly, the base may include a substrate and discrete fins on the substrate.

In various embodiments, the first region 100nl of the base 100 and the second region 100ns of the base 100 may be used to form N-type transistors, and the N-type transistor formed by the first region 100nl of the base 100 may have a threshold voltage lower than the N-type transistor formed by the second region 100ns of the base 100. Thus, the N-type transistor formed by the first region 100nl of the base 100 may have a work function layer thinner than the N-type transistor formed by the second region 100ns of the base 100.

In addition, the base 100 may further include a third region 100ps and a fourth region 100pl. The work function layer for the transistor formed by the third region 100ps of the base 100 may have a thickness greater than the work function layer for the transistor formed by the second region 100ns of the base 100. The work function layer for the transistor formed by the fourth region 100pl of the base 100 may have a thickness greater than the work function layer for the transistor formed by the third region 100ps of the base 100.

For example, the third region 100ps of the base 100 and the fourth region 100pl of the base 100 may be used to form P-type transistors. The P-type transistor formed by the third region 100ps of the base 100 may have a threshold voltage greater than the P-type transistor formed by the forth region 100pl of the base 100.

Thus, the work function layer for the P-type transistor formed by the fourth region 100pl of the base 100 may have a thickness greater than the work function layer of the P-type transistor formed by the third region 100ps of the base 100. The work function layer for the P-type transistor formed by the third region 100ps of the base 100 may have a thickness greater than the work function layer for the N-type transistor formed by the second region 100ns of the base 100. The work function layer for the N-type transistor formed by the second region 100ns of the base 100 may have a thickness greater than the work function layer for the N-type transistor formed by the first region 100nl of the base 100.

As shown in FIG. 3, the method for fabricating the semiconductor structure may further include forming a gate dielectric layer 110 on the base 100.

In various embodiments, the base 100 may further include a third region 100ps and a fourth region 100pl. Thus, when forming the gate dielectric layer 110, the gate dielectric layer 110 may also be located on the third region 100ps of the base 100, and the gate dielectric layer 110 may also be located on the fourth region 100pl of the base 100.

In various embodiments, the semiconductor structure may have a "high-K metal gate" structure. Accordingly, the exemplary step of forming the gate dielectric layer 110 on the base 100 thus may include: forming the gate dielectric layer 110 having a high-K dielectric layer.

The material of the high-k dielectric layer may include a gate dielectric material having a relative dielectric constant greater than the relative dielectric constant of silicon oxide. In various embodiments, the material of the high-k dielectric layer may include hafnium oxide. In other embodiments, the material of the high-K dielectric layer may include one or more materials selected from zirconium oxide, lanthanum oxide, aluminum oxide, titanium oxide, strontium titanate, lanthanum aluminum oxide, yttrium oxide, hafnium oxynitride, zirconium oxynitride, lanthanum oxynitride, aluminum oxynitride, titanium oxynitride, strontium titanium oxynitride, lanthanum aluminum oxynitride, and yttrium oxynitride.

The method of forming the gate dielectric layer 110 may be a chemical vapor deposition, a physical vapor deposition, an atomic layer deposition, or other suitable film deposition.

After providing the base 100 and before forming the gate dielectric layer 110, the method for fabricating the semiconductor structure may further include: forming an interface layer (IL) (not shown in FIG. 3) on the base 100, to solve the lattice mismatch issue between the base 100 and the gate dielectric layer 110.

Figure 4:
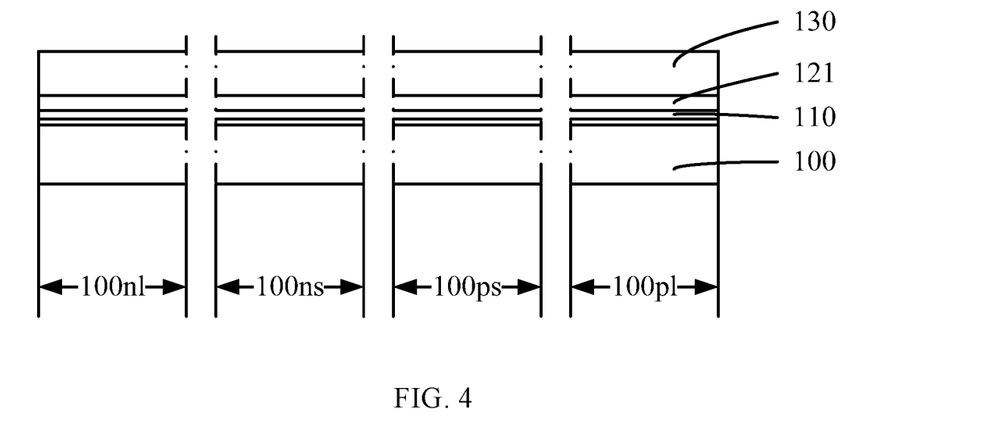

As shown in FIG. 4, the method for fabricating the semiconductor structure may further include: forming a first material layer 121 on the gate dielectric layer 110.

The first material layer 121 may be used to form a work function layer for the transistor formed by the first region 100nl of the base 100; and may also be used to form a work function layer for the transistor formed by the second region 100ns of the base 100.

In various embodiments, the base 100 may further include a third region 100ps and a fourth region 100pl. Accordingly, the first material layer 121 may also be used to form a work function layer for the transistor formed by the third region 100ps of the base 100, and a work function layer for the transistor formed by the fourth region 100pl of the base 100.

Thus, when forming the first material layer 121, the first material layer 121 may also be located above the third region 100ps of the base 100, and the first material layer 121 may also be located above the fourth region 100pl of the base 100.

In various embodiments, the first region 100nl of the base 100 and the second region 100ns of the base 100 may be used to form N-type transistors. Thus, when forming the first material layer 121, the first material layer 121 may include a layer of titanium nitride or stacked layers of titanium nitride and tantalum nitride, which may be formed by a chemical vapor deposition, a physical vapor deposition, an atomic layer deposition, or other suitable film deposition process.

As shown in FIG. 4, the method for fabricating the semiconductor structure may further include: forming an etch stop layer 130 on the first material layer 121.

The etch stop layer 130 may be used to protect the first material layer 121 and the gate dielectric layer 110 in a subsequent semiconductor process, thereby reducing the possibility of damage to the first material layer 121 and the gate dielectric layer 110, enlarging the process window of the subsequent semiconductor process, and reducing the process difficulty of fabricating the semiconductor structure.

The material of the etch stop layer 130 may be different from the material of the first material layer 121, thereby effectively stopping the etch process in the subsequent process and reducing the probability of damage to the first material layer 121 and the gate dielectric layer 110. For example, when forming the etch stop layer 130, the material of the etch stop layer 130 may include amorphous silicon, silicon nitride, or silicon oxide.

In various embodiments, the etch stop layer 130 may include an amorphous silicon layer. For example, the exemplary step of forming the etch stop layer 130 may include: forming an amorphous silicon cap layer on the first material layer 121; and carrying out a post cap annealing (PCA). The amorphous silicon cap layer on the first material layer 121 may serve as the etch stop layer 130.

The etch stop layer 130 may be formed without adding an additional process, by using the amorphous silicon cap layer formed prior to the post cap annealing treatment as the etch stop layer 130. Accordingly, the simplification of the process steps may be facilitated, the process difficulty may be reduced, and the process cost may be reduced.

It should be noted that, when the thickness of the etch stop layer 130 is too small, the etch may not be effectively stopped in the subsequent process, and the protection on the first material layer 121 and the gate dielectric layer 110 may not be guaranteed. When the thickness of the etch stop layer 130 is too large, the material may be easily wasted, and the process difficulty may be increased. In various embodiments, the etch stop layer 130 may have a thickness in the range of approximately 20 angstroms to 80 angstroms when forming the etch stop layer 130.

For example, the base 100 may include a first region 100nl and a second region 100ns. Accordingly, the etch stop layer 130 may be located on the first material layer 121 above the first region 100nl of the base 100 and above the second region 100ns of the base 100.

In various embodiments, the base 100 may further include a third region 100ps and a fourth region 100pl. Thus, when forming an etch stop layer 130, the etch stop layer 130 may also be located above the third region 100ps of the base 100, and the etch stop layer 130 may also be located above the fourth region 100pl of the base 100.

Figure 9:
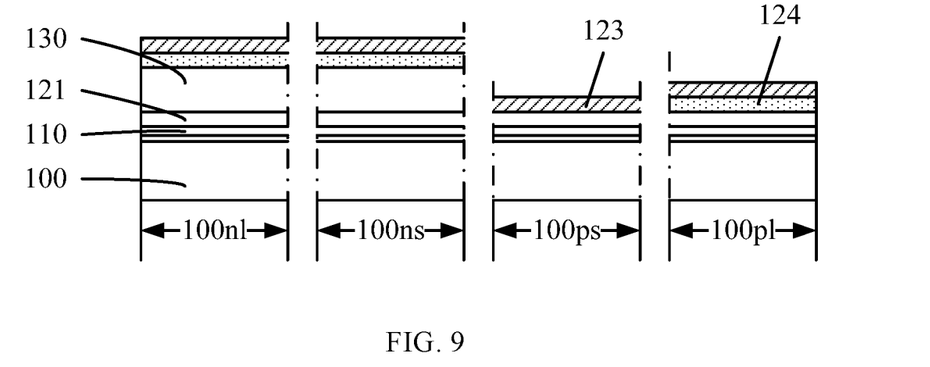
Figure 10:
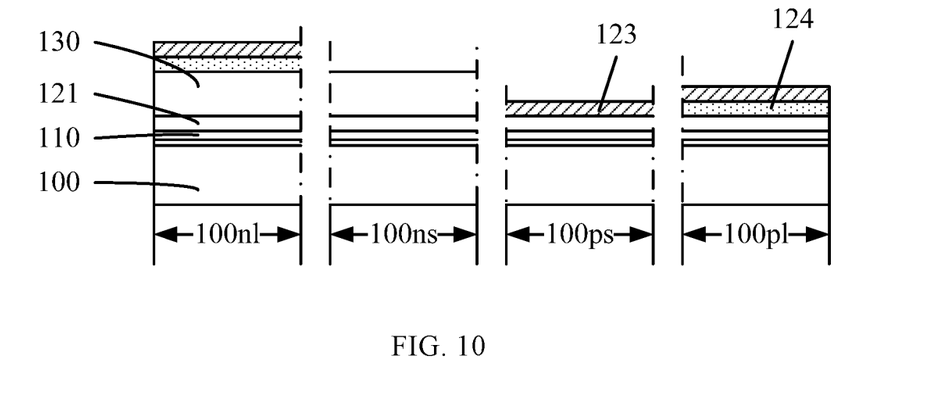
Figure 11:
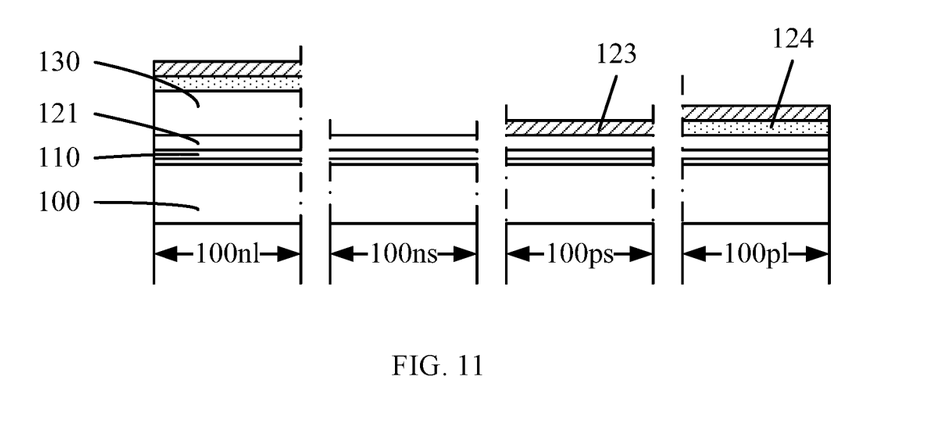

Referring to FIGS. 5-11, the method for fabricating the semiconductor structure may further include: removing the etch stop layer 130 above the second region 100ns (as shown in FIG. 11) to expose the first material layer 121 above the second region 100ns.

The step of removing the etch stop layer 130 above the second region 100ns may be used to expose the first material layer 121 above the second region 100ns, providing an operation surface for the subsequent process.

In various embodiments, the base 100 may further include a third region 100ps. Thus, as shown in FIGS. 5-9, the method for fabricating the semiconductor structure may further include: after forming the etch stop layer 130 on the first material layer 121, before removing the etch stop layer 130 above the second region 100ns, forming a third material layer 123 on the etch stop layer 130 and on the first material layer 121 above the third region 100ps.

The third material layer 123 may be used to form the work function layer for the transistor formed by the third region 100*ps* of the base 100.

Figure 6:
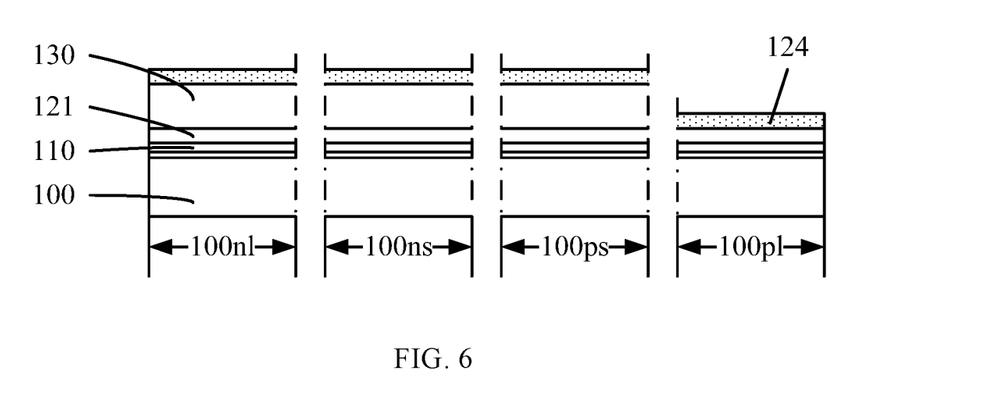
Figure 7:
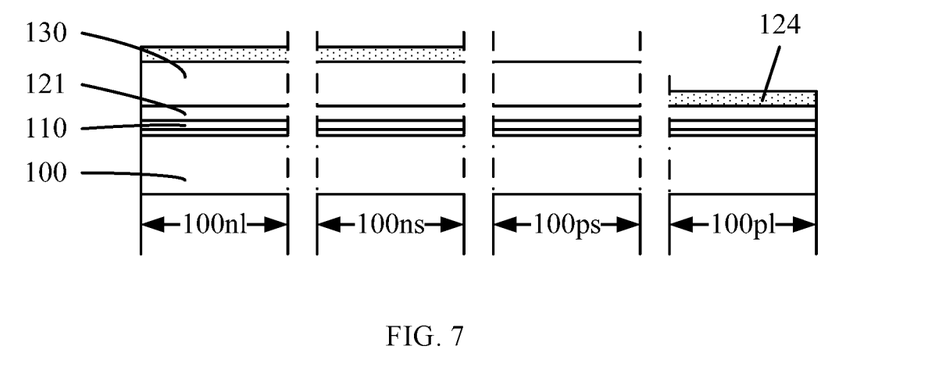
Figure 8:
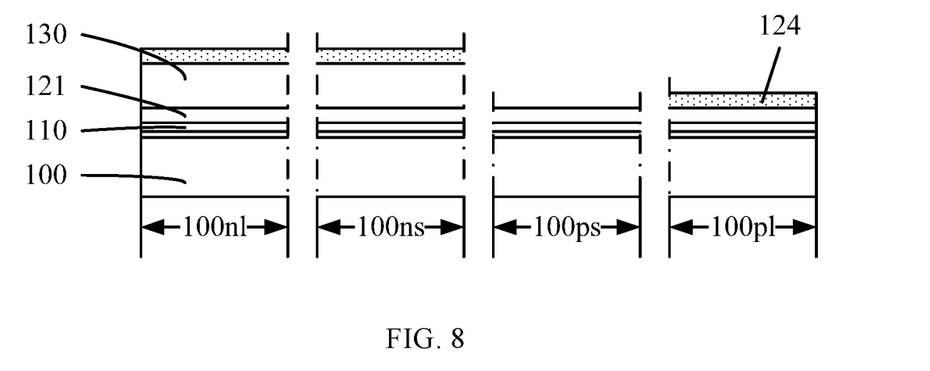

Because the etch stop layer 130 may also be located on the third region 100*ps* of the base 100, as shown in FIGS. 6-8, the method for fabricating the semiconductor structure may further include: after forming the etch stop layer 130, before forming a third material layer 123, removing the etch stop layer 130 above the third region 100*ps* to expose the first material layer 121 above the third region 100*ps*.

Figure 5:
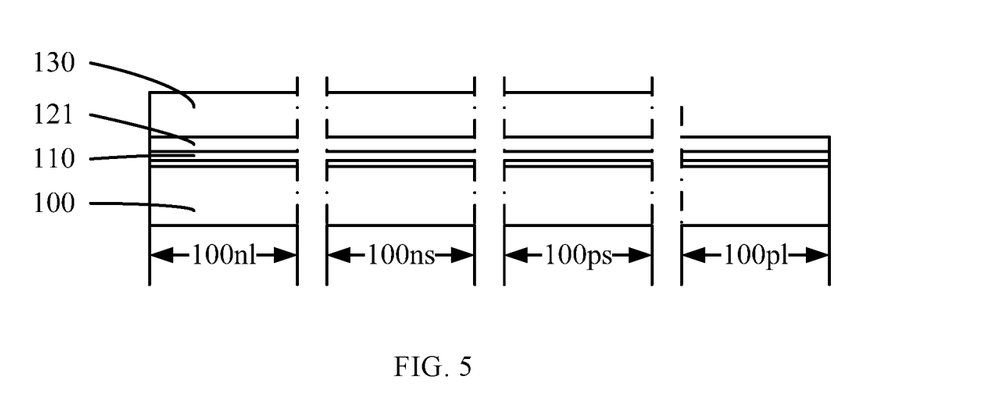

In addition, the base 100 may further include a fourth region 100*pl*. Thus, as shown in FIGS. 5-6, the method for fabricating the semiconductor structure may further include: after forming the etch stop layer 130 on the first material layer 121, before forming the third material layer 123 on the etch stop layer 130 and on the first material layer 121 above the third region 100*ps*, forming a fourth material layer 124 on the etch stop layer 130 and on the first material layer 121 above the fourth region 100*pl*.

The fourth material layer 124 may be used to form the work function layer for the transistor formed by the fourth region 100*pl* of the base 100.

It should be noted that, the etch stop layer 130 may also be located above the fourth region 100*pl* of the base 100. Thus, as shown in FIG. 5, after forming the etch stop layer 130, before forming the fourth material layer 124, the method for fabricating the semiconductor structure may further include: removing the etch stop layer 130 above the fourth region 100*pl* of the base 100 to expose the first material layer 121 above the fourth region 100*pl*.

The removing of the etch stop layer 130 above the fourth region 100*pl* of the base 100 may be used to expose the first material layer 121 above the fourth region 100*pl*, such that the formed fourth material layer 124 may cover the surface of the first material layer 121.

In various embodiments, the removing of the stopping layer 130 above the fourth gate dielectric layer 110*pl* may include: forming a first pattern layer (not shown) on the etch stop layer 130, where the pattern layer may expose the etch stop layer 130 above the fourth region 100*pl*; and removing the etch stop layer 130 above the fourth region 100*pl* with the first pattern layer as a mask. The fourth gate dielectric layer 110*pl* may refer to the gate dielectric layer above the fourth region 100*pl*.

For example, the first pattern layer may be used to pattern the etch stop layer 130 to protect the etch stop layer 130 above the first region 100*nl*, the second region 100*ns*, and the third region 100*ps*. In various embodiments, the first pattern layer may include a photoresist layer and may be formed by a coating process and a photolithography process.

In other embodiments, the first pattern layer may also be formed by a multiple patterning process (i.e. multiple patterning mask process). The multiple patterning process may include: a self-aligned double patterning (SaDP) process, a self-aligned triple patterning process, or a self-aligned quadruple patterning (i.e. Self-aligned Double Double Patterning, SaDDP) process.

The exemplary step of removing the etch stop layer 130 above the fourth region 100*pl* may include: removing the etch stop layer 130 above the fourth region 100*pl* by wet etching. By adopting wet etching to remove the etch stop layer 130, the damage caused by the process of removing the etch stop layer 130 to the gate dielectric layer 110 and the first material layer 121 above the fourth region 100*pl* may be effectively reduced. Accordingly, the quality of the formed transistor may be improved, and the performance of the semiconductor structure may be improved.

In various embodiments, the etch stop layer 130 may include an amorphous silicon layer. Thus, the exemplary step of removing the etch stop layer 130 by wet etching may include: etching with an alkaline etching solution to remove the etch stop layer 130. The alkaline etching solution may include tetramethylammonium hydroxide (TMAH) solution or aqueous ammonia ($NH_4OH$). In one embodiment, the etch stop layer 130 may be removed by a tetramethylammonium hydroxide (TMAH) solution.

Because the material of the etch stop layer 130 may be different from the material of the first material layer 121, during the wet etching removal of the etch stop layer 130, for the tetramethylammonium hydroxide (TMAH) solution, the etching rate for the etch stop layer 130 may be substantially different from the etching rate for the first material layer 121. Accordingly, the possibility of damage to the first material layer 121 caused by the etching process may be effectively reduced, etching process window may be enlarged, and the performance of the corresponding semiconductor structure may be improved.

In other embodiments, the etch stop layer above the fourth region may be removed by dry etching when removing the etch stop layer above the fourth region 100*pl*. But the dry etching may be a soft dry etching. For example, when removing the etch stop layer above the fourth region by dry etching, the dry etching process may be carried out by adopting a fluorine-containing plasma. The fluorine-containing plasma may include $CF_4$, $SF_6$ or other fluorine-based plasma.

After exposing the first material layer 121 above the fourth region 100*pl*, as shown in FIG. 6, the method for fabricating the semiconductor structure may further include: forming a fourth material layer 124 on the etch stop layer 130 and on the first material layer 121 above the fourth region 100*pl*.

In various embodiments, the transistor formed by the fourth region 100*pl* of the base 100 may be a P-type transistor. Thus, the material of the fourth material layer 124 may include titanium nitride, and may be formed by chemical vapor deposition, physical vapor deposition, atomic layer deposition, or other suitable film deposition process.

The method for fabricating the semiconductor structure may further include: after forming the fourth material layer 124, as shown in FIGS. 7-8, removing the etch stop layer 130 above the third region 100*ps* to expose the first material layer 121 above the third region 100*ps*.

Because the fourth material layer 124 may also be located on the etch stop layer 130 (as shown in FIG. 6). Thus, as shown in FIG. 7, the exemplary step of removing the etch stop layer 130 above the third region 100*ps* to expose the first material layer 121 above the third region 100*ps* may include: removing the fourth material layer 124 on the etch stop layer 130 above the third region 100*ps*, to expose the etch stop layer 130 above the third region 100*ps*.

For example, the exemplary step of removing the fourth material layer 124 on the etch stop layer 130 above the third region 100*ps* may include: forming a second pattern layer on the fourth material layer 124, where the second pattern layer may expose the fourth material layer 124 on the etch stop layer 130 above the third region 100*ps*; and removing the fourth material layer 124 on the etch stop layer 130 above the third region 100*ps*, with the second pattern layer as a mask, to expose the etch stop layer 130 above the third region 100*ps*.

The second pattern layer may be used to protect the etch stop layer 130 above the first region 100*nl* and the second region 100*ns*, and also to protect the fourth material layer 124 above the fourth region 100*pl*. In various embodiments, the second pattern layer may include a photoresist layer, which may be formed by a coating process and a photolithography process. In other embodiments, the second pattern layer may also be formed by a multiple patterning process.

The exemplary step of removing the fourth material layer 124 above the third region 100*ps* may be used to expose the etch stop layer 130 above the third region 100*ps*, providing a process surface for removing the etch stop layer 130.

The exemplary step of removing the fourth material layer 124 above the third region 100*ps* may include: removing the fourth material layer 124 above the third region 100*ps* by wet etching. Because the material of the fourth material layer 124 may include titanium nitride, when removing the fourth material layer 124 by wet etching, the etching solution may include a mixed solution of $NH_4OH$, $H_2O_2$ and water (SC1 solution), a mixed solution of $NH_4$, $H_2O_2$ and water, or a mixed solution of HCl, $H_2O_2$ and water (SC2 solution).

Because the etch stop layer 130 may be provided above the third region 100*ps*, the etch stop layer 130 may effectively reduce the possibility of damage to the gate dielectric layer 110 and the first material layer 121 above the third region 100*ps*, during the wet etching to remove the fourth material layer 124. Accordingly, the quality of the formed transistor may be improved, and the performance of the fabricated semiconductor structure may be improved.

After exposing the etch stop layer 130 above the third region 100*ps*, as shown in FIG. 8, the method for fabricating the semiconductor structure may further include: removing the etch stop layer 130 above the third region 100*ps* to expose the first material layer 121 above the third region 100*ps*.

The exemplary step of removing the etch stop layer 130 above the third region 100*ps* may be used to expose the first material layer 121 above the third region 100*ps*, thereby providing an operation surface for subsequent processes.

The exemplary step of removing the etch stop layer 130 above the third region 100*ps* may include: removing the etch stop layer 130 by wet etching or dry etching, which may be the same or similar etching process as for removing the etch stop layer 130 above the fourth region 100*pl* as previously described. Of course, any suitable methods may be used to remove a portion of the etch stop layer 130.

After exposing the first material layer 121 above the third region 100*ps*, as shown in FIG. 9, the method for fabricating the semiconductor structure may further include: forming a third material layer 123 above the etch stop layer 130, and on the first material layer 121 above the third region 100*ps*.

The third material layer 123 may be used to form a work function layer for the transistor formed by the third region 100*ps* of the base 100.

In various embodiments, the transistor formed by the third region 100*ps* of the base 100 may be a P-type transistor. Thus, the material of the third material layer 123 may include titanium nitride, and may be formed by chemical vapor deposition, physical vapor deposition, atomic layer deposition or other suitable film deposition process.

In various embodiments, the base 100 may further include a fourth region 100*pl*. Thus, when forming the third material layer 123 above the etch stop layer 130, and on the first material layer 121 above the third region 100*ps*, the third material layer 123 may also be located on the fourth material layer 124 above the fourth region 100*pl*.

In addition, the fourth material layer 124 may also be located on the etch stop layer 130 above the first region 100*nl* and the second region 100*ns*. Thus, the third material layer 123 may also be located on the fourth material layer 124. That is, the third material layer 123 may also be located on the fourth material layer 124 on the etch stop layer 130 above the first region 100*nl* and the second region 100*ns*.

The method for fabricating the semiconductor structure may further include: after forming the third material layer 123, as shown in FIGS. 10-11, removing the etch stop layer 130 above the second region 100*ns* to expose the first material layer 121 above the second region 100*ns*.

Because the third material layer 123 and the fourth material layer 124 may also be provided on the etch stop layer 130 above the second region 110*ns*, as shown in FIG. 10, the step of removing the etch stop layer 130 above the second region 110*ns* may include: removing the fourth material layer 124 and the third material layer 123 above the second region 110*ns*, to expose the etch stop layer 130 above the second region 110*ns*.

In various embodiments, the exemplary step of removing the fourth material layer 124 and the third material layer 123 above the second region 110*ns* may include: forming a third pattern layer on the third material layer 123, where the third pattern layer may expose the third material layer 123 above the etch stop layer 130 above the second region 100*ns*; and removing the fourth material layer 124 and the third material layer 123 above the etch stop layer 130 above the second region 100*ns*, with the third pattern layer as a mask, until the etch stop layer 130 above the second region 100*ns* is exposed.

The third pattern layer may be used to protect the etch stop layer 130 above the first region 100*nl*, also to protect the third material layer 123 above the third region 100*ps*, and to protect the third material layer 123 and the fourth material layer 124 above the fourth region 100*pl*. In various embodiments, the third pattern layer may include a photoresist layer, and may be formed by a coating process and a photolithography process. In other embodiments, the third pattern layer may also be formed by a multiple patterning process.

The exemplary step of removing the fourth material layer 124 and the third material layer 123 above the etch stop layer 130 above the second region 100*ns* may be used to expose the etch stop layer 130 above the second region 100*ns*, thereby providing a process surface for removing the etch stop layer 130.

The exemplary step of removing the fourth material layer 124 and the third material layer 123 above the etch stop layer 130 above the second region 100*ns* may include: removing the fourth material layer 124 and the third material layer 123 above the second region 110*ns* by wet etching.

The third material layer 123 and the fourth material layer 124 may both include titanium nitride. Thus, the removal of one or both of the third material layer 123 and the fourth material layer 124 may refer to the above-described process for etching the fourth material layer 124. Of course, any suitable methods may be used to remove the third material layer 123 and/or the fourth material layer 124.

The method for fabricating the semiconductor structure may further include: after exposing the etch stop layer 130 above the second region 110*ns*, as shown in FIG. 11, removing the etch stop layer 130 above the second region 110*ns*.

The step of removing the etch stop layer 130 above the second region 110*ns* may be used to expose the first material layer 121 above the second region 100*ns*, thereby providing a process surface for the subsequent processes.

For example, the step of removing the etch stop layer 130 above the second region 110*ns* may include: removing the etch stop layer 130 by wet etching or dry etching, which may be the same or similar etching process as for removing the etch stop layer 130 above the fourth region 100*pl* as previously described. Of course, any suitable methods may be used to remove a portion of the etch stop layer 130.

Figure 12:
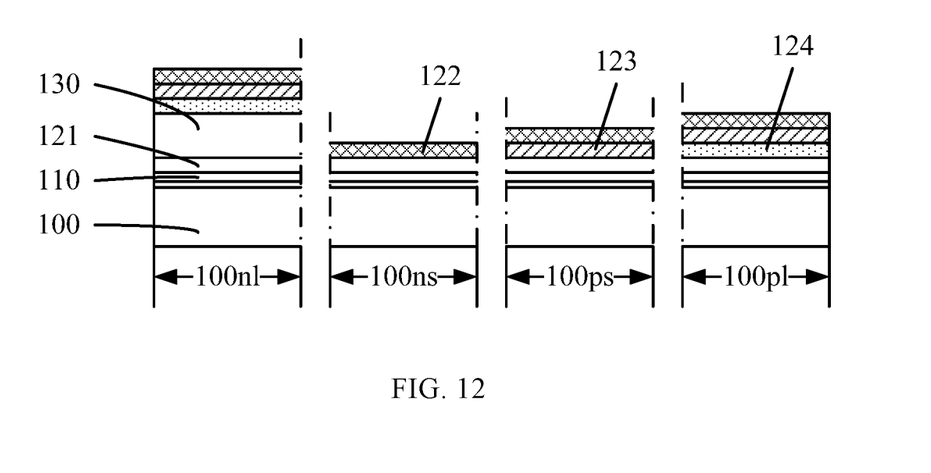

As shown in FIG. 12, the method for fabricating the semiconductor structure may further include: forming a second material layer 122 above the etch stop layer 130, and on the first material layer 121 above the second region 100*ns*. The second material layer 122 and the first material layer 121 above the second region 100*ns* may be used to form the work function layer for the transistor formed by the second region 100*ns* of the base 100.

The second material layer 122 may be used to form the work function layer for the transistor formed by the second region 100*ns* of the base 100. In various embodiments, the second region 100*ns* of the base 100 may be used to form an N-type transistor. Thus, when forming the second material layer 122, the material of the second material layer 122 may include titanium nitride, and may be formed by chemical vapor deposition, physical vapor deposition, atomic layer deposition, or other suitable film deposition process.

In various embodiments, the base 100 may also include a third region 100*ps* and a fourth region 100*pl*. Thus, when forming the second material layer 122, the second material layer 122 may also be located on the third material layer 123. For example, the second material layer 122 may be located on the third material layer 123 above the third region 100*ps* and the fourth region 100*pl*.

The second material layer 122 and the first material layer 121 above the second region 100*ns* may be used to form a work function layer for the transistor formed by the second region 100*ns* of the base 100. The second material layer 122, the third material layer 123, and the first material layer 121 above the third region 100*ps* may be used to form the work function layer for the transistor formed by the third region 100*ps* of the base 100. Accordingly, the transistor formed by the third region 100*ps* of the base 100 may have a work function layer thicker than the transistor formed by the second region 100*ns* of the base 100.

In addition, the third material layer 123 above the fourth region 100*pl* may be further located on the fourth material layer 124 above the fourth region 100*pl*. Thus, the second material layer 122, the third material layer 123, the fourth material layer 124, and the first material layer 121 above the fourth region 100*pl* may be used to form a work function layer for the transistor formed by the fourth region 100*pl* of the base 100. Accordingly, the transistor formed by the fourth region 100*pl* of the base 100 may have a work function layer thicker than the transistor formed by the third region 100*ps* of the base 100.

Figure 13:
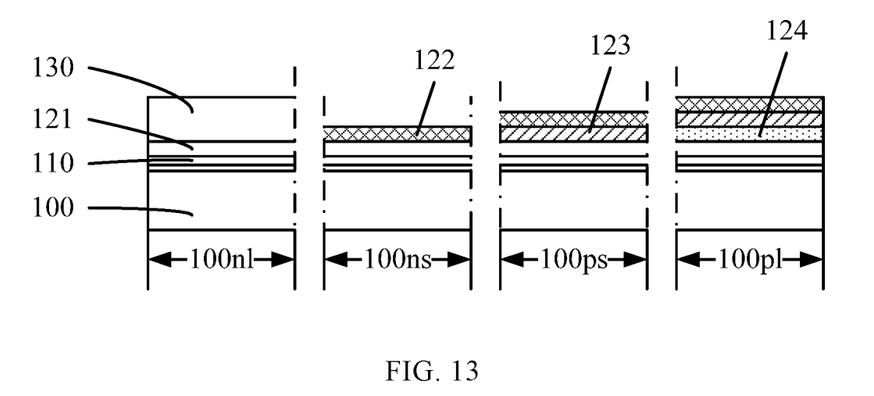
Figure 14:
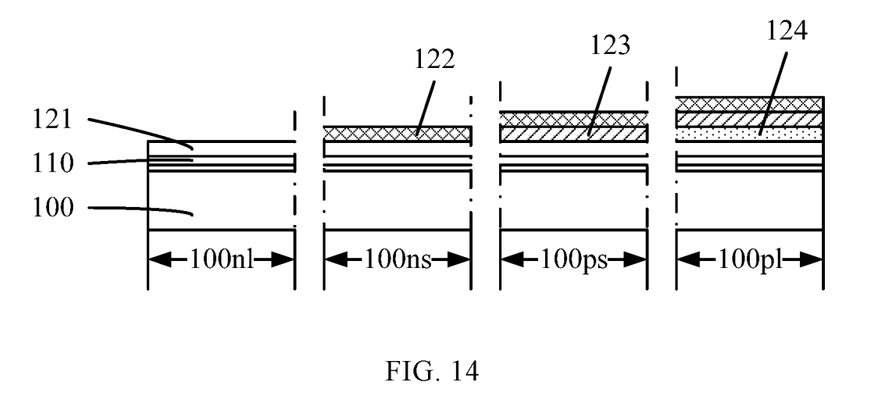

Referring to FIGS. 13-14, the method for fabricating the semiconductor structure may further include: removing the second material layer 122 above the first region 100*nl*, with the etch stop layer 130 as a stopping layer, to expose the first material layer 121 above the first region 100*nl*. The first material layer 121 above the first region 100*nl* may be used to form the work function layer for the transistor formed by the first region 100*nl* of the base 100.

For example, the step of exposing the first material layer 121 by removing the second material layer 122 above the first region 100*nl* with the etch stop layer 130 as a stopping layer may include: as shown in FIG. 13, removing the second material layer 122 above the first region 100*nl*, with the etching stopping layer 130 as a stopping layer, to expose the etch stop layer 130 above the first region 100*nl*; and, as shown in FIG. 14, removing the etch stop layer 130 above the first region 100*nl*, to expose the first material layer 121 above the first region 100*nl*.

As shown in FIG. 12, a third material layer 123 may be provided above the etch stop layer 130 above the first region 100*nl*. Thus, the step of exposing the first material layer 121, by removing the second material layer 122 above the first region 100*nl* with the etch stop layer 130 as a stopping layer, may include: exposing the etch stop layer 130, by removing the second material layer 122 and the third material layer 123 above the first region 100*nl*, with the etch stop layer 130 as a stopping layer; and exposing the first material layer 121 by removing the etch stop layer 130.

In addition, in various embodiments, a fourth material layer 124 may be provided on the etch stop layer 130 above the first region 100*nl*. That is, a fourth material layer 124, a third material layer 123, and a second material layer 122 may be provided above the etch stop layer 130 above the first region 100*nl*. Thus, the step of exposing the first material layer 121, by removing the second material layer 122 above the first region 100*nl* with the etch stop layer 130 as a stopping layer, may include: exposing the etch stop layer 130, by removing the second material layer 122, the third material layer 123, and the fourth material layer 124 above the first region 100*nl* with the etch stop layer 130 as a stopping layer; and exposing the first material layer 121 by removing the etch stop layer 130.

For example, the step of removing the fourth material layer 124, the third material layer 123, and the second material layer 122 above the first region 100*nl* may include: forming a fourth pattern layer on the second material layer 122, where the fourth pattern layer may expose the second material layer 122 above the first region 100*nl*; and removing the fourth material layer 124, the third material layer 123, and the second material layer 122 above the first region 100*nl*, with the fourth pattern layer as a mask, until the etch stop layer 130 above the first region 100*nl* is exposed.

The fourth pattern layer may be used to protect the second material layer 122, the third material layer 123, and the fourth material layer 124 above the fourth region 100*pl*; also to protect the second material layer 122 and the third material layer 123 above the third region 100*ps*; and to protect the second material layer 122 above the second region 100*ps*. In various embodiments, the fourth pattern layer may include a photoresist layer, and may be formed by a coating process and a photolithography process. In other embodiments, the fourth pattern layer may also be formed by a multiple patterning process.

The step of removing the fourth material layer 124, the third material layer 123, and the second material layer 122 above the first region 100*nl* may be used to expose the etch stop layer 130, providing a process surface for removing the etch stop layer 130.

The step of removing the fourth material layer 124, the third material layer 123, and the second material layer 122 above the first region 100*nl* may include: removing the fourth material layer 124, the third material layer 123, and the second material layer 122 above the first region 100*nl* by wet etching.

Because the second material layer 122, the third material layer 123 and the fourth material layer 124 each may include titanium nitride. Thus, the removal of one or more of the second material layer 122, the third material layer 123 and the fourth material layer 124 may refer to the above-described process for etching the fourth material layer 124. Of course, any suitable methods may be used to remove the second material layer 122, the third material layer 123 and/or the fourth material layer 124.

The step of removing the etch stop layer 130 above the first region 100nl may be used to expose the first material layer 121 above the first region 100nl.

For example, the step of removing the etch stop layer 130 above the first region 100nl may include: removing the etch stop layer 130 by wet etching or dry etching, which may be the same or similar etching process as for removing the etch stop layer 130 above the fourth region 100pl as previously described. Of course, any suitable methods may be used to remove a portion of the etch stop layer 130.

In various embodiments, the N-type transistor formed by the second region 100ns of the base 100 may have a work function layer thicker than the N-type transistor formed by the first region 100nl of the base 100; the P-type transistor formed by the third region 100ps of the base 100 may have a work function layer thicker than the N-type transistor formed by the second region 100ns of the base 100; and the P-type transistor formed by the fourth region 100pl of the base 100 may have a work function layer thicker than the P-type transistor formed by the third region 100ps of the base 100.

Thus, the thickness of the first material layer 121 may be determined according to the thickness of the work function layer for the N-type transistor formed by the first region 100nl of the base 100. The thickness of the second material layer 122 may be determined according to the thickness of the work function layer for the N-type transistor formed by the second region 100ns of the base 100 and the thickness of the first material layer 121. The thickness of the third material layer 123 may be determined according to the thickness of the work function layer for the P-type transistor formed by the third region 100ps of the base 100, the thickness of the first material layer 121, and the thickness of the second material layer 122. The thickness of the fourth material layer 124 may be determined according to the thickness of the work function layer for the P-type transistor formed by the fourth region 100pl of the base 100, the thickness of the first material layer 121, the thickness of the second material layer 122, and the thickness of the third material layer 123.

In various embodiments, the base 100 may include a first region 100nl, a second region 100ns, a third region 100ps, and a fourth region 100pl, forming the transistors having work function layers with a successively increased thickness, which is merely for illustrative purposes. In other embodiments, the base 100 may include any two regions selected from of the first region 100nl, the second region 100ns, the third region 100ps, and the fourth region 100pl.

In addition, in various embodiments, the first region 100nl, the second region 100ns, the third region 100ps, and the fourth region 100pl may be isolated from each other. In other embodiments, the first region, the second region, the third region, and the fourth region may also be adjacent regions. Further, any number of the first regions, the second regions, the third regions, or the fourth regions may be included for the disclosed semiconductor structure, more regions, e.g., a fifth region, a sixth region, etc. may also be added.

In the present disclosure, an etch stop layer may be formed on the first material layer after the formation of the first material layer; and the second material layer above the first region may be removed with the etch stop layer as an etch stopping layer. The process window for the step of removing the second material layer above the first region may be effectively enlarged by adding the etch stop layer, thereby effectively reducing the process control difficulty of removing the second material layer above the first region. Accordingly, the accuracy of the thickness control of the work function layer in the semiconductor structure may be improved, and the performance of the semiconductor structure may be improved. In addition, by removing the second material layer above the first region with the etch stop layer as a stopping layer, the gate dielectric layer may be protected by the etching stop layer, facilitating the reduction of the thickness of the first material layer, and facilitating the adjustment of the threshold voltage of the corresponding transistor.

In certain embodiments, the etch stop layer may be an amorphous silicon cap layer formed in a post cap annealing process. Thus, the formation of the etch stop layer may not require an additional process step. And the etch stop layer may be removed by wet etching. No additional process risk may be introduced for the fabrication of the semiconductor structure, facilitating the improvement on the performance of the semiconductor structure without increasing the process steps and the process cost.

In another embodiment, the etch stop layer may also protect the first material layer and the gate dielectric layer during the process, and reduce damage to the gate dielectric layer and the first material layer, facilitating the improvement on the performance of the fabricated semiconductor structure.

The present disclosure provides a method for fabricating a semiconductor structure. The method may include: providing a base including a first region and a second region; forming a gate dielectric layer and a first material layer; forming an etch stop layer; removing the etch stop layer above the second region; forming a second material layer; and exposing the first material layer above the first region with the etch stop layer as a stopping layer.

The process window of the step for removing the second material layer above the first region may be effectively enlarged by adding the etch stop layer, thereby effectively reducing the process control difficulty of removing the second material layer above the first region. Accordingly, the accuracy of the thickness control of the work function layer in the semiconductor structure may be improved, and the performance of the semiconductor structure may be improved.

In addition, by removing the second material layer above the first region with the etch stop layer as a stopping layer, the gate dielectric layer may be protected by the etch stop layer, thereby facilitating the reduction of the thickness of the first material layer, and facilitating the adjustment of the threshold voltage of the corresponding transistor.

Compared with conventional methods and semiconductor structures, the present disclosure provides the technical solution having the following advantages.

In the present disclosure, an etch stop layer may be formed on the first material layer after the formation of the first material layer; and the second material layer above the first region may be removed with the etch stop layer as a stopping layer. The process window of the step for removing the second material layer above the first region may be effectively enlarged by adding the etch stop layer, thereby effectively reducing the process control difficulty of removing the second material layer above the first region. Accordingly, the accuracy of the thickness control of the work function layer in the semiconductor structure may be improved, and the performance of the semiconductor structure may be improved. In addition, by removing the second material layer above the first region with the etch stop layer as a stopping layer, the gate dielectric layer may be protected by the etch stop layer, facilitating the reduction of the thickness of the first material layer, and facilitating the adjustment of the threshold voltage of the corresponding transistor.

In certain embodiments, the etch stop layer may be an amorphous silicon cap layer formed in a post cap annealing process. Thus, the formation of the etch stop layer may not require an additional process step. And the etch stop layer may be removed by wet etching. No additional process risk may be introduced for the fabrication of the semiconductor structure, facilitating the improvement on the performance of the semiconductor structure without increasing the process steps and the process cost.

In another embodiment, the etch stop layer may also protect the first material layer and the gate dielectric layer during the process, and reduce damage to the gate dielectric layer and the first material layer, facilitating the improvement on the performance of the fabricated semiconductor structure.

It is apparent that the described embodiments are some but not all of the embodiments of the present invention. The present invention is not limited to the described embodiments. Based on the disclosed embodiments, persons of ordinary skill in the art may make various changes and modifications consistent with the present disclosure, all of which are within the spirit and scope of the present invention. Further, in the present disclosure, the disclosed embodiments and the features of the disclosed embodiments may be combined under conditions without conflicts. The scope of the present disclosure is defined by the scope of the claims.

What is claimed is:

1. A semiconductor structure, comprising:
    a base including a first region, a second region, a third region, and a fourth region, used for a first transistor, a second transistor, a third transistor, and a fourth transistor, respectively;
    a gate dielectric layer on the first, second, third and fourth regions of the base;
    a first material layer on the gate dielectric layer;
    a second material layer on the first material layer above the fourth region;
    a third material layer on the first material layer above the third region and on the second material layer above the fourth region; and
    a fourth material layer on the third material layer above the third and fourth regions and on the first material layer on the second region, wherein:
        the first material layer above the first region is used as a first work function layer for the first transistor,
        the first and fourth material layers above the second region are used as a second work function layer for the second transistor,
        the first, third and fourth material layers above the third region are used as a third work function layer for the third transistor,
        the first, second, third and fourth material layers above the fourth region are used as a fourth work function layer for the fourth transistor, and
        a thickness of the first work function layer is smaller than a thickness of the second work function layer, the thickness of the second work function layer is smaller than a thickness of the third work function layer, the thickness of the third work function layer is smaller than a thickness of the fourth work function layer.

2. The semiconductor structure according to claim 1, wherein:
    the first and second transistors formed in the first and second regions of the base include N-type transistors, and
    the N-type transistor in the first region of the base has a threshold voltage smaller than the N-type transistor formed in the second region of the base.

3. The semiconductor structure according to claim 1, wherein:
    the third and fourth transistors formed in the third and fourth regions of the base include P-type transistors, and
    the P-type transistor in the third region of the base has a threshold voltage greater than the P-type transistor formed in the fourth region of the base.

4. The semiconductor structure according to claim 1, wherein:
    one or both of the first and second material layers include a titanium nitride layer or a stacked layer including a titanium nitride layer and a tantalum nitride layer.

5. The semiconductor structure according to claim 1, wherein:
    one or both of the third and fourth material layers are made of a material including titanium nitride.

6. The semiconductor structure according to claim 1, wherein:
    the first material layer is directly on the gate dielectric layer,
    the second material layer is directly on the first material layer in the second region,
    the third material layer is directly on the first material layer in the third region and the second material layer is directly on the third material layer, and
    the fourth material layer is directly on the first material layer in the fourth region, the third material layer is directly on the fourth material layer and the second material layer is directly on the third material layer.

* * * * *